US005799116A

United States Patent [19]
Yamamoto

[11] Patent Number: 5,799,116
[45] Date of Patent: Aug. 25, 1998

[54] ELECTROMAGNETIC WAVE-TO-OPTICAL SIGNAL CONVERTING AND MODULATING DEVICE AND A COMMUNICATION SYSTEM USING THE SAME

[75] Inventor: Takehiro Yamamoto, Osaka, Japan

[73] Assignee: Sharp Kabushiki Kaisha, Osaka, Japan

[21] Appl. No.: 688,286

[22] Filed: Jul. 29, 1996

[30] Foreign Application Priority Data

Aug. 8, 1995 [JP] Japan ................................ 7-201989

[51] Int. Cl.$^6$ ............................................. G02B 6/10
[52] U.S. Cl. ........................ 385/2; 385/8; 385/9; 385/12
[58] Field of Search ................................. 385/2, 3, 5, 8, 385/9, 10, 40, 12

[56] References Cited

U.S. PATENT DOCUMENTS

| 5,076,655 | 12/1991 | Bridges | 385/3 |
| 5,488,677 | 1/1996 | Tokano | 385/3 |
| 5,574,805 | 11/1996 | Toba et al. | 385/3 |

FOREIGN PATENT DOCUMENTS

| 3243517 A1 | 5/1984 | Germany . |
| 2-184772 | 7/1990 | Japan . |
| 3276927 | 12/1991 | Japan . |
| 4177929 | 6/1992 | Japan . |
| 4196623 | 7/1992 | Japan . |
| 5-2043 | 1/1993 | Japan . |
| 7-20178 | 1/1995 | Japan . |
| WO 95/02193 | 1/1995 | WIPO . |

OTHER PUBLICATIONS

"Photonic Systems for Antenna Applications", M. L. VanBlaricum, IEEE Antennas and Propagation Magazine, vol. 36, No. 5, Oct. 1994 pp. 30–38.

*Primary Examiner*—John Ngo

[57] ABSTRACT

An electromagnetic wave-to-optical signal converting and modulating device includes: a substrate presenting the electro-optical effect; at least a pair of optical waveguide paths which are formed on the substrate and arranged in parallel to each other and are joined at their ends; electrodes which are formed along the optical waveguide paths and have the antenna function for detecting electric field signals around the external space; a light supplying means with an optical fiber cable for supplying light to the optical waveguide paths; and an optical detector with a light signal receiver for detecting and processing the light emitted from the optical waveguide paths. This device directly modulates the light which is passing through the waveguide paths with an external space electric field signal carrying information. In this arraignment, when the light signal has a predetermined frequency, the light signal and the external space electric field signal are directly mixed so that the electric field signal is converted down.

19 Claims, 12 Drawing Sheets

ELECTROMAGNETIC WAVE-TO-OPTICAL SIGNAL CONVERTING AND MODULATING DEVICE AND A COMMUNICATION SYSTEM USING THE SAME

BACKGROUND OF THE INVENTION

1. Field of the Invention

The present invention relates to an electromagnetic wave-to-optical signal converting and modulating device for converting radio waves into light signals and a communication system using it.

2. Description of the Prior Art

In recent years, the frequency of radio waves used in the field of broadcasting has increasingly been made higher, as is typically notable in the satellite broadcasting. On the other hand, the development of social economy increases demands for radio waves, such as various mobile communication systems and data communications by radio waves because of the popularization of cordless data-terminal apparatus. The current range of radio frequencies, however has become saturated, therefore these fields also are facing the necessity to make the frequency higher and more broad-banded.

Meanwhile, in the field of cable network systems, construction of optical fiber networks has been carried forward for the broad-band transmission network which enables a mass of data to be handled altogether at high speeds. From the streams of these social background, there is a demand of construction of an integrated system which uses both merits, i.e., the convenience of the radio transmission system with the performance of mass transmission capacity of the optical-fiber transmission system. As the specific system, a system has recently drawn attention wherein a mass of information superimposed on the optical carrier signal is transmitted up to a base station via the optical fiber and the exchange of the information between the local station and terminals is performed using high-frequency radio wave signals.

Such a system needs O/E converting modules which convert a light signal in the base station into a radio wave signal as well as E/O converting modules which convert the radio wave signal into a light signal, therefore, the enlargement of the system increases the number of the converting modules in the facility of the base station. Therefore, the realization of the system has significantly depended on how the converting modules can be simplified and downsized.

Up to now, a radio signal is first converted into an electric signal, which in turn is used to modulate the light source. However, if, for example, it becomes possible to directly convert a radio signal into a light signal without needing a step of converting the radio signal into an electric signal, it will be possible to slim the electric portion and therefore simplify the E/O converting module (so that electromagnetic waves can directly be converted into a light signal). That is, it will become possible to achieve a system wherein the optical portion and the other electrical parts are efficiently fused.

As a prior art example of converting electromagnetic waves (electric fields in the external space) into light signals directly, Japanese Patent Application Laid-Open Hei 2 No. 184,772, Japanese Patent Application Laid-Open Hei 5 No. 2,043, etc. disclosed field antennas in which an optical crystal should be used to exactly measure the space distribution etc. of unwanted radiation (interfering electromagnetic waves). Further, a noise sensor head which includes an integrated antenna was disclosed in Japanese Patent Application Laid-Open Hei 7 No. 20,178.

The basic structure of the former one is shown in FIG. 1. In this figure, reference numerals designate the following components: a light source 1; a lens 2; optical fiber cables 3; a lens 4; a polarizer 5; a crystal presenting the electro-optical effect 6; sensor rods 7 and 7'; a phase compensator 8; an analyzer 9; a lens 10; an optical detector 11; and a receiver 12. The section including components 4 through 10 enclosed by the broken line, constitutes an optical modulator 13. Designated at 16, 16' are optical modulation electrodes.

In this prior art example, a light signal from light source 1 is inputted via optical fiber cable 3 to optical modulator 13 where the light signal is modulated by crystal 6 presenting the electro-optical effect under the field intensity which is detected by sensor rods 7 and 7' and applied between optical modulation electrodes 16 and 16'. Then the signal is transmitted to optical detector 11 again via optical fiber cable 3. The modulated light signal is converted into the electric signal in the optical detector and is detected in receiver 12.

In the above optical modulator 13, polarizer 5 selects linear polarized wave components which have a polarized plane angled 45° with the optical axis of crystal 6 presenting the electro-optical effect, from the light emitted from optical fiber cable 3 and inputs them to crystal 6. The light incident on crystal 6 is phase modulated with the voltage which is applied from sensor rods 7 and 7' and will be outputted as elliptically polarized waves. The elliptically polarized wave component is picked out by analyzer 9, thus the light signal modulated in intensity will be obtained. At this time, the relation between an applied voltage E and a modulated signal Vm can be represented by the following formula (1):

$$Vm = \alpha Vi\{1 + \sin(\beta E)\} \quad (1)$$

where Vi is an amplitude of the light signal, $\alpha$ and $\beta$ are conversion coefficients. From formula (1), if $\beta E$ is very small, the intensity of the converted signal will be proportional to the strength of the applied field (applied voltage E).

FIG. 2 shows an example of a specific structure of optical modulator 13 above. In this figure, reference numerals designate the following components: a lens 4; a polarizer 5; a crystal 6 presenting the electro-optical effect; sensor rods 7 and 7'; a phase compensator 8; an analyzer 9; a lens 10; a polarization maintain optical fiber 14 connected to the light source in the schematic view; a single-mode optical fiber 15 connected to the optical detector in the schematic view; optical modulation electrodes 16 and 16'; and a modulator housing box 17.

As a crystal 6 presenting the electro-optical effect, $LiNbO_3$ is used in this structure, and the crystal 6 is accumulated at the clearance between the two metal rods for sensor reds 7 and 7' arranged in series. Two crystals of $LiNbO_3$ are joined so that each optical axis is perpendicular to the other. This arrangement is to compensate the variation of natural birefringence which depends on the temperature variation of the surroundings.

FIG. 3 shows another example of a specific structure of optical modulator 13 above. In this figure, the same reference numerals as in FIG. 2 designate the same components. In this example, instead of using an optical crystal as the optical modulator 13 in the former structure, an optical waveguide type device constituting a Mach-Zehnder interferometer is used. Therefore, no polarizer, analyzer or phase compensator will be needed in this structure.

Since the purpose of this antenna, however is to exactly measurer frequency-characteristics of interfering waves over a wide band range, the receiver sensitivity should be made uniform over a certain wide-band range of frequencies (some hundreds Hz to some GHz). Accordingly, this device is constructed to meet the demand. In other words, this device is not suitable to be used as an antenna for radio wave communications wherein only a specified frequency range should be made resonant and be received at a high sensitivity.

Further, as shown in FIG. 1, rather large metal sensor rods 7 and 7' are provided perpendicular to the optical modulator portion, therefore this geometry of the total part of the sensor rods and optical modulator 13, or the size of the electromagnetic wave-to-optical signal converting section, made it difficult to suffice the requirement that the E/O converting module should be made compact and efficient in order to achieve the integrated system in which both the convenience in the radio communication and the performance of mass transmission capacity in the optical fiber communication are made the most use of.

In the configuration disclosed in the Japanese Patent Application Laid-Open Hei 7 No. 20,178, since parts corresponding to the sensor rods are formed on the crystal substrate, the device can be made compact but is only dedicated to measuring noise etc. That is, this configuration is not the one which presents a high sensitivity to a specified frequency or a specified direction. Accordingly, this device does not have any function for data communication.

SUMMARY OF THE INVENTION

It is therefore an object of the present invention to provide an electromagnetic wave-to-optical signal converting and modulating device for data communication which directly converts the radio signal into the light signal and has a compact and flat electromagnetic wave-to-optical signal converting section as well as to provide an data communication system using the device.

In order to attain the above object, the first aspect of the invention resides in an electromagnetic wave-to-optical signal converting and modulating device for data communication which comprises: a substrate presenting the electro-optical effect; at least a pair of optical waveguide paths which are formed on the substrate and arranged in parallel to each other and are joined at their ends; electrodes which are formed along the optical waveguide paths and have the antenna function for detecting electric field signals around the external space; a light supplying means for supplying light to the optical waveguide paths; and a light signal receiving means for detecting light outputted from the optical waveguide paths and processing it, and is constructed so that the light which is passing through the waveguide paths is directly modulated with an external space electric field signal carrying information.

Next, the second aspect of the invention lies in an electromagnetic wave-to-optical signal converting and modulating device having the above first aspect, wherein the electrodes constitute a type of antenna selected from the following assortment:

(a) dipole antenna;

(b) patch type antenna;

(c) Yagi antenna; and (d) half-wave ($\lambda/2$) dipole antenna in which a plurality of dipole antenna elements having different lengths are arranged along the optical waveguide paths.

Further, the third aspect of the invention resides in an electromagnetic wave-to-optical signal converting and modulating device having any of the above first or second feature, wherein a metallic reflecting plate for reflecting electric fields around the external space is provided on the substrate's surface opposite to the surface on which the electrodes are formed.

Moreover, the fourth aspect of the invention lies in an electromagnetic wave-to-optical signal converting and modulating device having the first aspect above, wherein the light supplying means is a type selected from the following assortment:

(a) means for supplying unmodulated light having a constant intensity;

(b) means for supplying light having a predetermined frequency; and (c) means for supplying light from a light source via an optical fiber.

These configurations above will enable the miniature electromagnetic wave-to-optical signal converting and modulating device to produce a condition of resonance to a certain band of frequencies so that it can receive external space electric field signals with high sensitivity. In one word, it is possible to provide the antenna function for radio communications, without having any projected antenna.

In this case, if a light signal having a predetermined frequency (or being intensity modulated with a predetermined frequency) is supplied from the light supplying means, this light signal is mixed with the aforementioned external space electric field signal so that a heterodyned frequency of the light signal and the electromagnetic wave can be detected. That is, the electromagnetic wave-to-optical signal converting section will be able to perform the mixing function.

Next, the fifth aspect of the invention relates to a data communication system. That is, the data communication system of the invention comprises: an optical fiber network; a base station on the optical fiber network; an electromagnetic wave-to-optical signal converting and modulating device disposed the base station; and a terminal to which an electromagnetic wave signal received by the electromagnetic wave-to-optical signal converting and modulating device in the base station is transmitted, wherein the modulator includes: a substrate presenting the electro-optical effect; at least a pair of optical waveguide paths which are formed on the substrate and arranged in parallel to each other and are joined at their ends; electrodes which are formed along the optical waveguide paths and have the antenna function for detecting electric field signals around the external space; a light supplying means for supplying light to the optical waveguide paths; and a light signal receiving means for detecting light outputted from the optical waveguide paths and processing it, and the modulator is constructed so that the light which is passing through the waveguide paths is directly modulated with an external space electric field signal carrying information.

Further, the sixth aspect of the invention resides in a data communication system having the fifth aspect above, wherein the electromagnetic wave-to-optical signal converting and modulating device receives electromagnetic waves from satellites and converts the received wave into a light signal so that the light signal is supplied to the network.

Finally, the seventh aspect of the invention resides in a data communication system having the fifth aspect above, wherein the electromagnetic wave-to-optical signal converting and modulating device is used as a receiving antenna device for satellite broadcasting, and forms a satellite broadcast receiving system which transmits the reception signal from satellites to satellite broadcast receivers via optical fibers.

In accordance with these configurations, it is possible to receive radio signal of information having a specified band of frequencies from a terminal device with high sensitivity and supply it to the optical fiber network. Additionally, when the electromagnetic wave-to-optical signal converting section is made to also have the mixer function, it is possible to convert down the reception signal into an intermediate-frequency signal whilst the signal remains as light signal. Based on the heterodyne detecting scheme, the desired signal must be present on the intermediate-frequency signal whose frequency is lower than that of the original signal. Since the system only needs to detect the intermediate-frequency signal, the frequency characteristic required for the optical detector can be drastically be alleviated so that it is possible to achieve an effective system in which electromagnetic waves, light and electric circuits are coupled and comprehended.

Further, in the invention, the electromagnetic wave-to-optical signal converting and modulating device of the invention above is used as the means for receiving a electromagnetic wave from a satellite and converting it to a light signal to be supplied to the optical fiber network. Since all the current antenna devices need to have a down-converter circuit, the structure is complicated. In accordance with the invention, since the down-converter circuit can be built into the indoor apparatus as the tuner circuit etc., it is possible to make the receiving antenna device for satellite broadcasting drastically compact and simple, and thus this configuration has advantages in outside installation space as well as its reliability.

DESCRIPTION OF THE PREFERRED EMBODIMENTS

Embodiments of the present invention will hereinafter be described in detail with reference to the accompanying drawings.

First Embodiment

Figure 4:
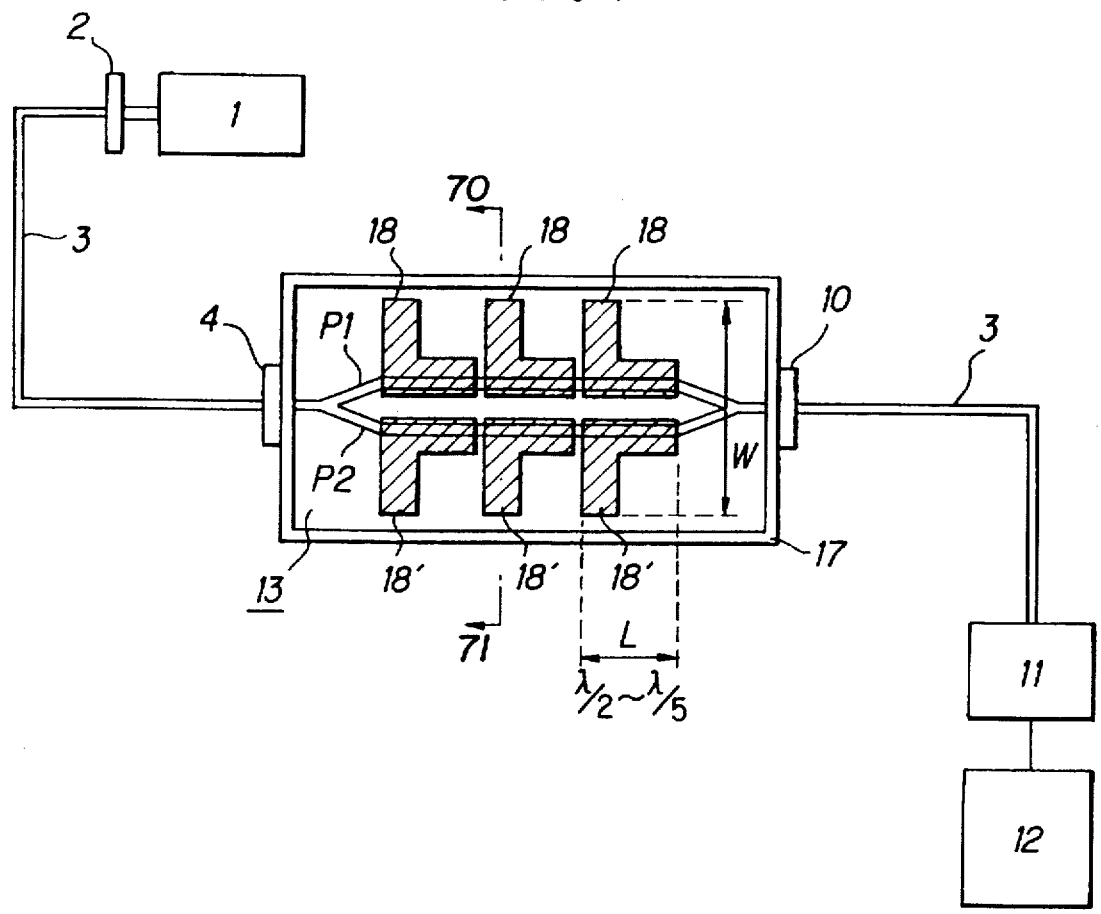
FIG. 4 is a view showing a specific embodiment of an electromagnetic wave-to-optical signal converting and modulating device.
Figure 5:
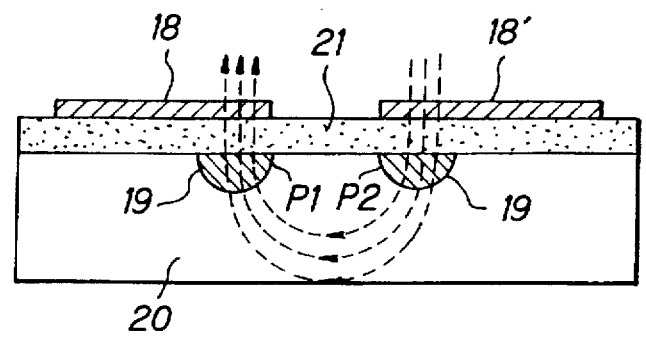
FIG. 5 is a sectional view taken on a line 70–71 in FIG. 4.

FIGS. 4 and 5 show a specified embodiment of the invention. A light source 1 in this embodiment uses a semiconductor laser but it should not be limited to just this. Reference numerals 2 and 3 designate a lens and optical fiber cables, respectively. Designated at 4 and 10 are lenses which are arranged on the input and output sides of an optical modulator 13 and are attached respectively on the front and rear walls of a housing box 17 of optical modulator 13.

Optical modulator 13 is composed of: a substrate 20 having the electro-optical effect; a pair of optical waveguide paths P1 and P2 which are formed on substrate 20 and arranged in parallel but are joined at their ends; and electrodes 18 and 18' for optical modulation formed along these optical waveguide paths P1 and P2. The diameter of optical waveguide paths P1 and P2 is about some µm and these paths are spaced by some µm to some ten µm. Electrodes 18 and 18' also have the antenna function for detecting electric field signals in the external space around optical modulator 13.

In this embodiment, in order to make the optical system compact and integrated in optical modulator 13, optical waveguide paths P1 and P2 are produced on substrate 20 presenting the electro-optical effect, thereby forming a Mach-Zehnder interferometer. As shown in FIG. 5 which is taken on a sectional plane designated by a line 70–71 in FIG. 4, optical waveguide paths P1 and P2 are produced by forming a metallic titanium (Ti) film of some µm wide on substrate 20 of $LiNbO_3$ which was cut in a pertinent orientation, and subjecting it to a thermal diffusion process at 1,000° C. for about 10 hours.

After the formation of optical waveguide paths P1 and P2, a buffer layer (cladding layer in the optical waveguide paths) 21 consisting of an insulator such as $SiO_2$ of about 1 µm thick is formed on substrate 20 in order to inhibit the transmission loss of light. Further, prepared on the buffer layer 21 is a metallic deposition film of Au, Cu or Al, etc. of about 1 to 5 µm thick. This film is made to undergo an etching treatment, thus electrodes 18 and 18' for optical modulation will be formed.

In this embodiment, as shown in FIG. 4, three L-shaped, half-wave (λ/2) dipole antennas are integrally formed along each of optical waveguide paths P1 and P2. In general, a λ/2 in air will be 1.5 cm when the frequency of the receiving signal is 10 GHz and it will be 5 mm when the frequency is 30 GHz. In practice, due to the reduction effect of wavelength in dielectric materials, size W of the antenna or λ/2 will be reduced substantially to a magnitude which is calculated by dividing these lengths (1.5 cm and 5 mm) by the root of the dielectric constant of a material used under the electrodes. The length L of the feeder portion of the antenna (the portion which is in parallel with the optical wave guide path) is about λ/2 to λ/5.

Figure 7:
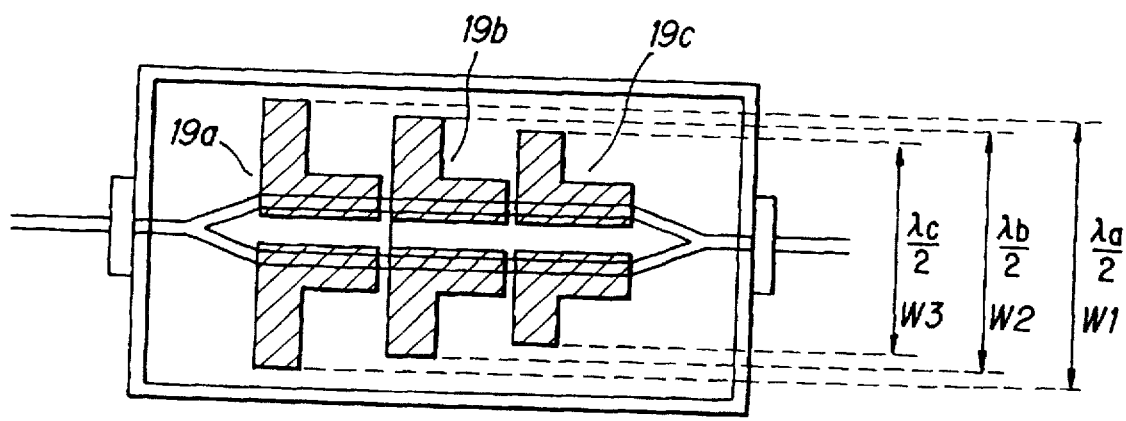
FIG. 7 is a view showing another variation of an optical modulator of the invention.
Figure 8:
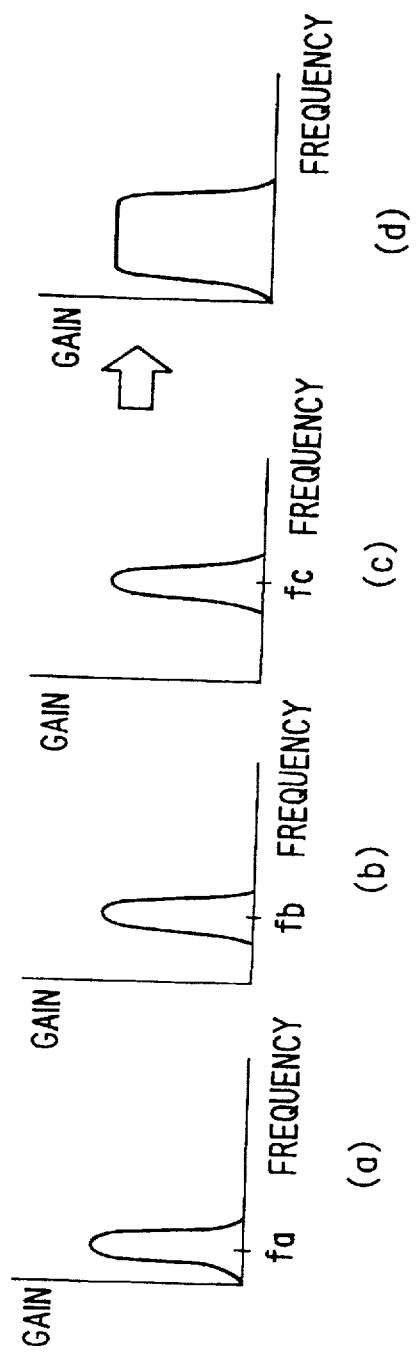
FIG. 8 is a chart showing the frequency characteristic of the optical modulator of FIG. 7.

As shown in FIG. 7, when antenna elements 19a, 19b and 19c are integrally formed so that their sizes $W_1$, $W_2$ and $W_3$ are varied slightly, it is possible to obtain combined frequency characteristic (d) which is produced by superimposing three different resonant frequency characteristics (a), (b) and (c), as shown in FIG. 8. Therefore, it is possible to enlarge the receiving band width of an electromagnetic wave-to-optical signal converting section. Here, (a), (b) and (c) in the figure designate the characteristics of antenna elements 19a, 19b and 19c, respectively.

Figure 6:
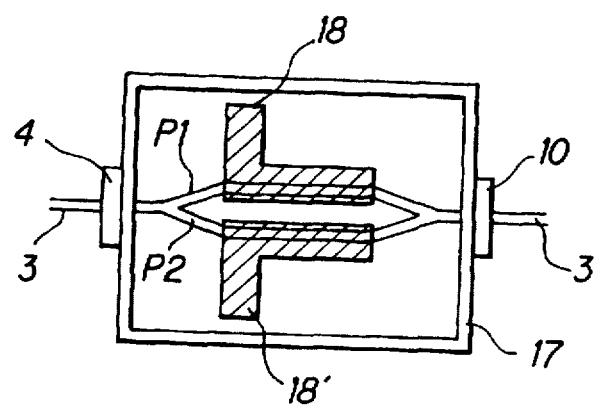
FIG. 6 is a view showing another embodiment of an optical modulator.

It should be noted that, instead of integrating plural half-wave (λ/2) dipole antenna elements as stated above, it is possible to adopt a structure having a single antenna element as shown in FIG. 6, as required.

Figure 9:
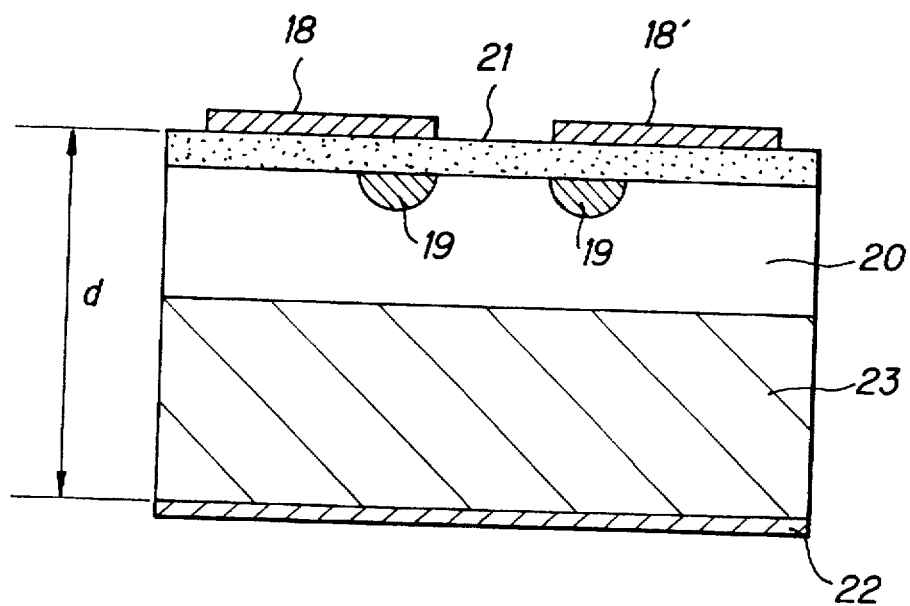
FIG. 9 is a sectional view showing another mode of an optical modulator of the invention.

Further, as shown in FIG. 9, by providing a reflective plate 22 of a metal on the rear side of LiNbO₃ substrate 20, in a position a distance 'd' apart from the top surface, it is possible to increase the gain of the antenna.

Since the stable quality of LiNbO₃ substrate 20 can only be assured up to some millimeters, the distance 'd' should be adjusted depending upon the wavelength used by providing a spacer layer 23 of an insulator such as SiO₂ so as to be about λ/4. Since λ/4 in air will be 7.5 mm when the frequency is 10 GHz and it will be 2.5 mm when the frequency is 30 GHz, the thickness of spacer layer 23 must be at most some millimeters under the consideration of the aforementioned wavelength reduction effect.

Here, instead of forming substrate 20 from LiNbO₃, if the substrate is formed from, for instance, an organic material etc. which is inexpensive even if the thickness becomes large, and is able to present stable quality characteristics, just using substrate 20 will provide distance 'd'; therefore it will be no longer necessary to provide spacer layer 23.

Now, the operation of the embodiment thus configured will be explained. In FIG. 4, an unmodulated light signal emitted from light source 1 is made incident on optical fiber cable 3 which is composed of, for example, polarization maintain optical fibers. The light signal transmitted via this optical fiber cable 3 will pass through optical modulator 13 presenting the electro-optical effect. An external electric field will generate a voltage between electrode 18 and 18' for optical modulation which function as antennas. This voltage produces a strong electric field (shown by broken lines in FIG. 5) in the optical waveguide path of Ti-diffused LiNbO₃ which constitutes optical modulator 13, and consequently the dielectric constant inside the waveguide path varies.

For this reason, two light waves which propagate through different passages, i.e., waveguide paths P1 and P2, travel different distances, producing a time lag between the two, so interference between the two light waves occurs at their meeting point. The interference between the light waves will vary depending on the applied voltage and therefore can be represented by the following formula:

$$P_{out}=(P_{in}/2)\{1+\sin(\pi V/V\pi)\} \quad (2)$$

where $P_{out}$ is a light signal output, $P_{in}$ is a light input power, V is an applied voltage, $V_\pi$ is the half-wave voltage. The half-wave voltage means that if this voltage is applied between the electrodes, the phase difference generated by the voltage applied will differ in phase by π/2. Here, if V is sufficiently small compared to $V_\pi$, formula (2) will be rewritten as follows:

$$P_{out}=(P_{in}/2)(1+\pi V/V_\pi) \quad (3)$$

As apparent from the above, the light wave will undergo optical intensity modulation which is proportional to the strength of the external electric field.

The thus modulated light signal is now transmitted via output-side optical fiber cable 3 which is formed of signal-mode optical fibers, for example, to an optical detector 11 which is located at a position away from the optical modulator, where the light signal is converted into an electric signal, which in turn is detected in a receiver 12.

In this way, the intensity modulation which a light signal from light source 1 undergoes, depends on the strength of the external electric field, therefore this embodiment is able to operate as an electromagnetic wave-to-optical signal converting and modulating device. As substitute materials for the substrate presenting the electro-optical effect other than that used in this embodiment, it is possible to use inorganic materials such as LiTaO₃, BaTiO₃, and organic materials such as electric field-oriented polymers (a material in which an organic substance presenting large second-order non-linear electro-optical effect is coupled or diffused in a polymer having a low dielectric constant, and the resulting material is subjected to an electric field-orientation process so that it will present a large electro-optic constant), etc.

Figure 1:
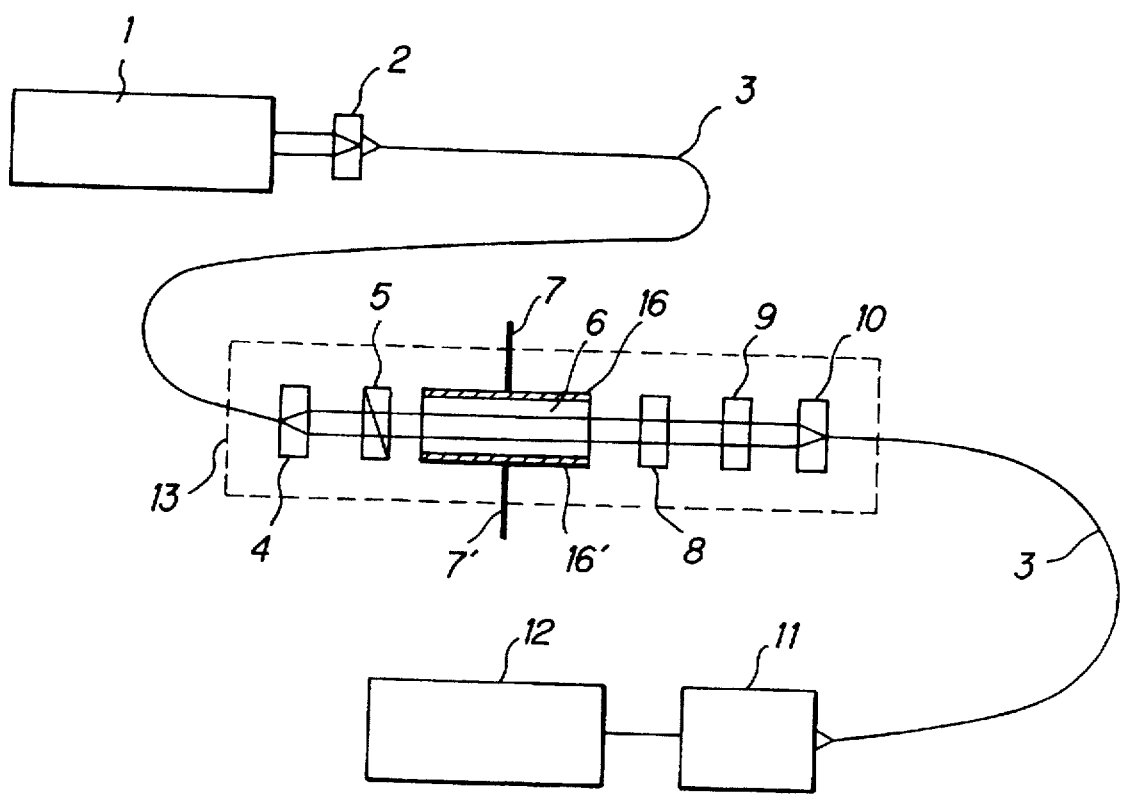
FIG. 1 is a view showing a prior art electromagnetic wave-to-optical signal converting and modulating device.
Figure 2:
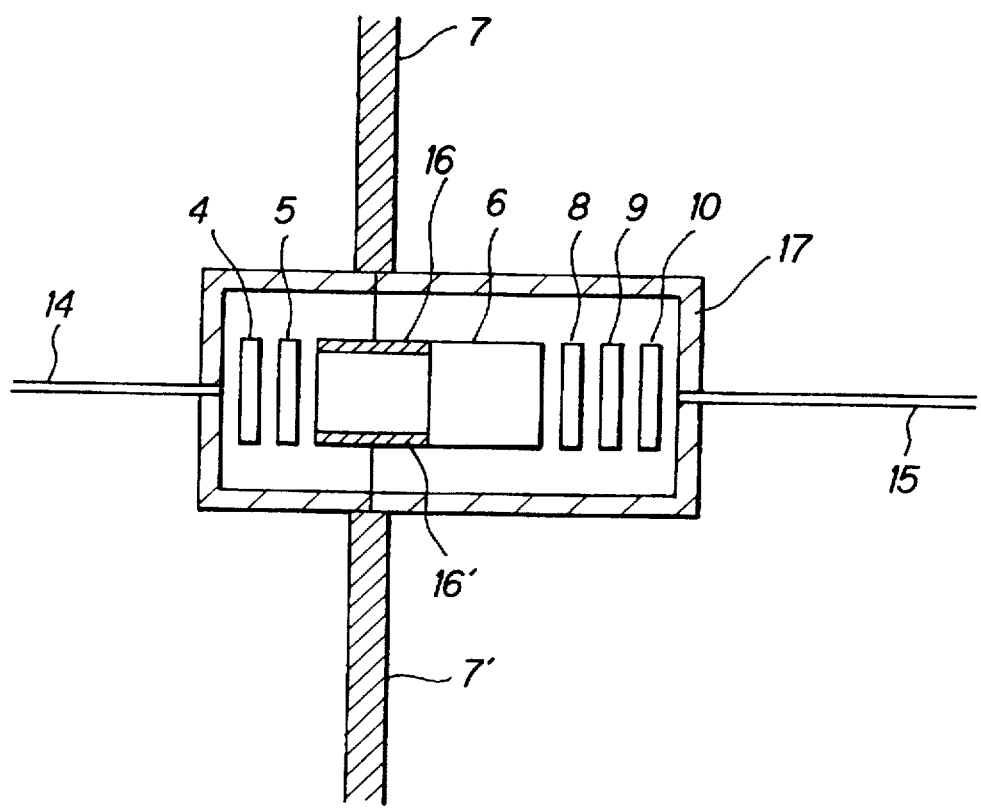
FIG. 2 is a view showing an optical modulator of FIG. 1.
Figure 3:
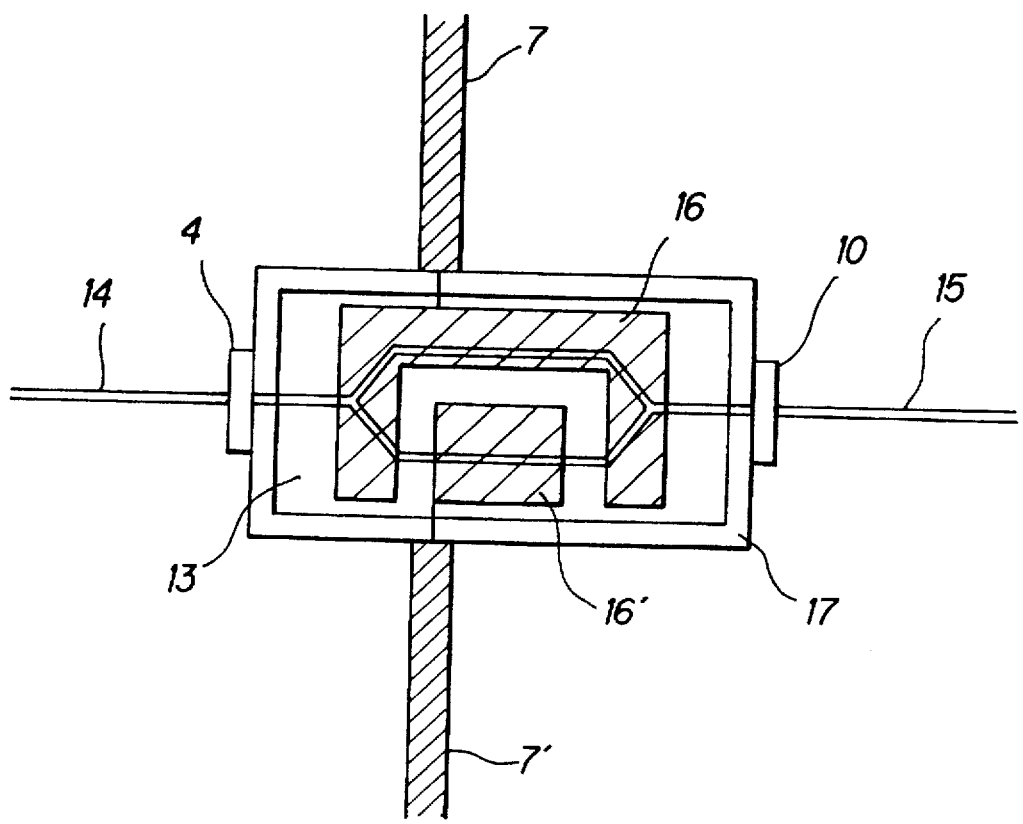
FIG. 3 is a view showing another prior art example of an optical modulator.
Figure 10A:
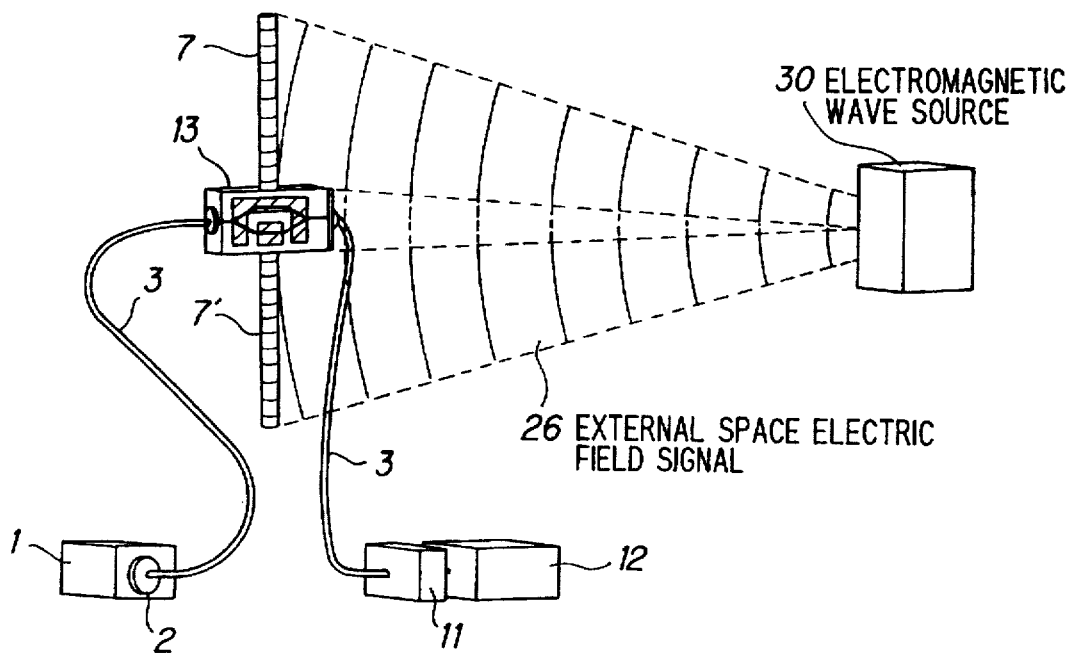
FIG. 10A is a diagram showing the feature of the optical modulator of the prior art example shown in FIG. 3.
Figure 10B:
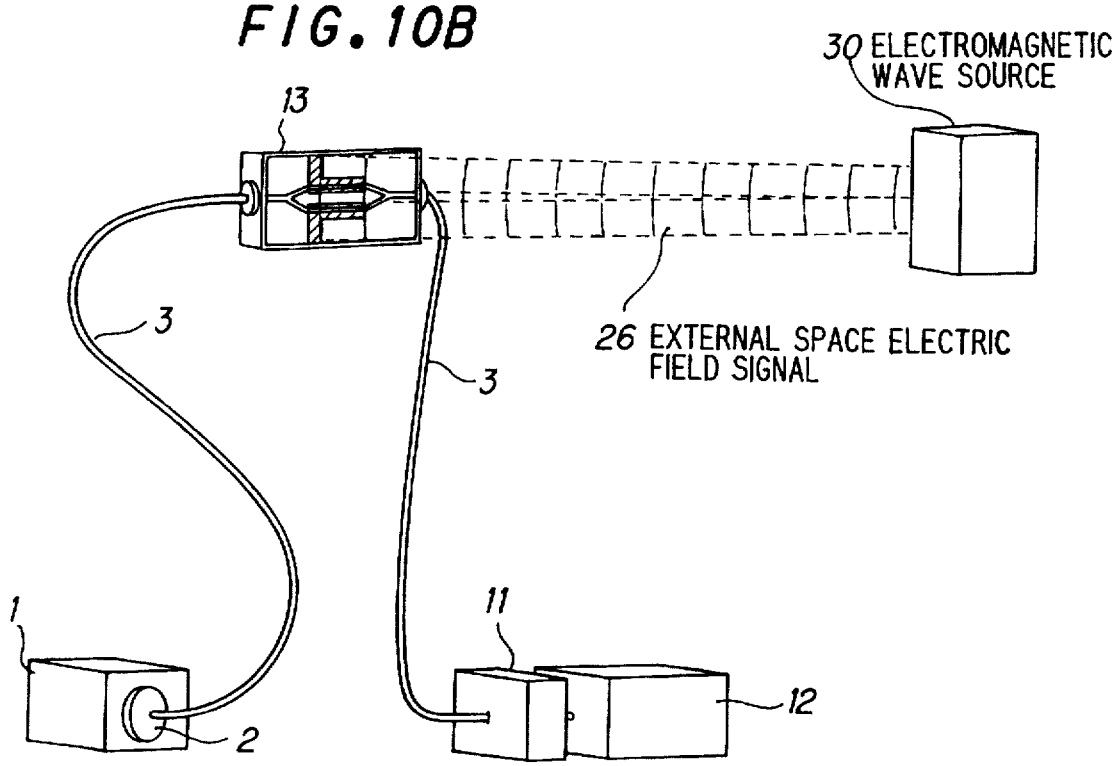
FIG. 10B is a diagram showing the feature of the optical modulator of the invention shown in FIG. 6.

FIGS. 10A and 10B illustrate that the above embodiment of the invention has more directional properties to an electric field signal in the external space, compared to the prior art example. Here, FIG. 10A shows the case of the prior art example shown in FIG. 3 and FIG. 10B shows the case of the embodiment shown in FIG. 6. In these figures, designated at 30 is an electromagnetic wave source.

Figure 11:
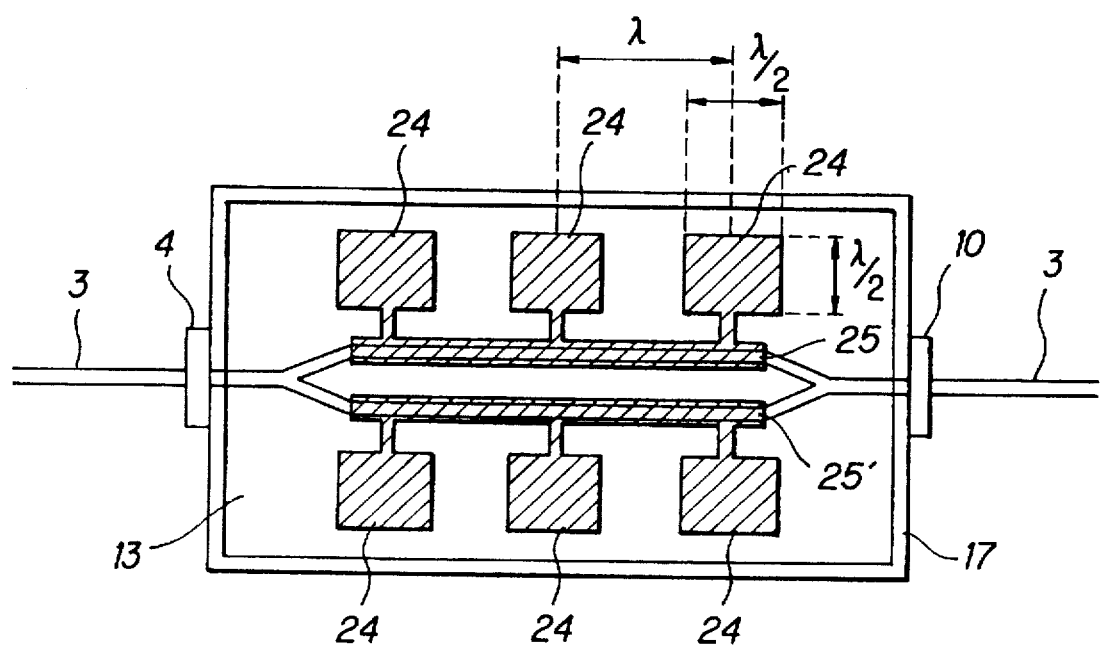
FIG. 11 is a view showing a patch-type antenna structure of an optical modulator of the invention.
Figure 12:
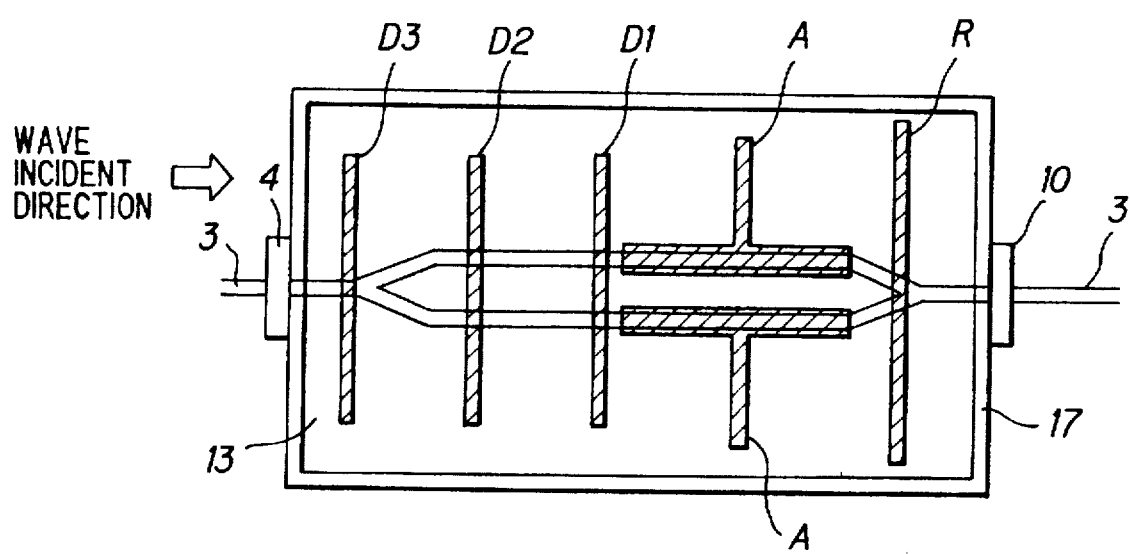
FIG. 12 is a view showing an Yagi antenna structure of an optical modulator of the invention.

Next, other specific examples of the electrodes for optical modulation having the antenna function are shown in FIGS. 11 and 12. FIG. 11 shows a configuration in which patch type antenna elements are integrated. The size, or the length and width of a patch 24 are both about λ/2 (a λ/2 in air will be 1.5 cm when the frequency of the receiving signal is 10 GHz and it will be 5 mm when the frequency is 30 GHz, besides the aforementioned wavelength reduction effect should be considered), and the distance between the patches is about λ. In the case of this example, a pair of three elements connected in series are provided, and an electric field will be applied to the optical waveguide paths via feeder lines 25 and 25'. By increasing the number of patches integrated, it is possible to further enhance the strength of the applied electric field, and thus it is possible to modulate the light at a higher efficiency.

FIG. 12 shows a configuration which has the function of a five-element Yagi antenna. The sizes of the elements are: an element A is about λ/2 in length; an element R is something longer than element A; and elements D1, D2 and D3 are something shorter than element A. These elements are spaced in parallel about λ/4 apart from one from the other. Supplying of electric fields is performed via element A only. This array presents strong directional properties of the receiving sensitivity and has the highest gain or maximum sensitivity to the electric field which is incident thereon in the direction of the arrow in the figure. The gain will differ depending on the number of constituting elements; in this example where five elements are integrated, the improvement of the power gain can be expected to be about 10 dB for each λ/2-dipole antenna element.

Thus, it becomes possible to provide an electromagnetic wave-to-optical signal converting and modulating device having a compact, high-efficient electromagnetic wave-to-optical signal converting section by designing and fabricating the electrodes for optical modulation so as to have the antenna function, like the above embodiments, in conformity with the required conditions (such as the use frequency band and the directional performance to electromagnetic waves).

Second Embodiment

Figure 13:
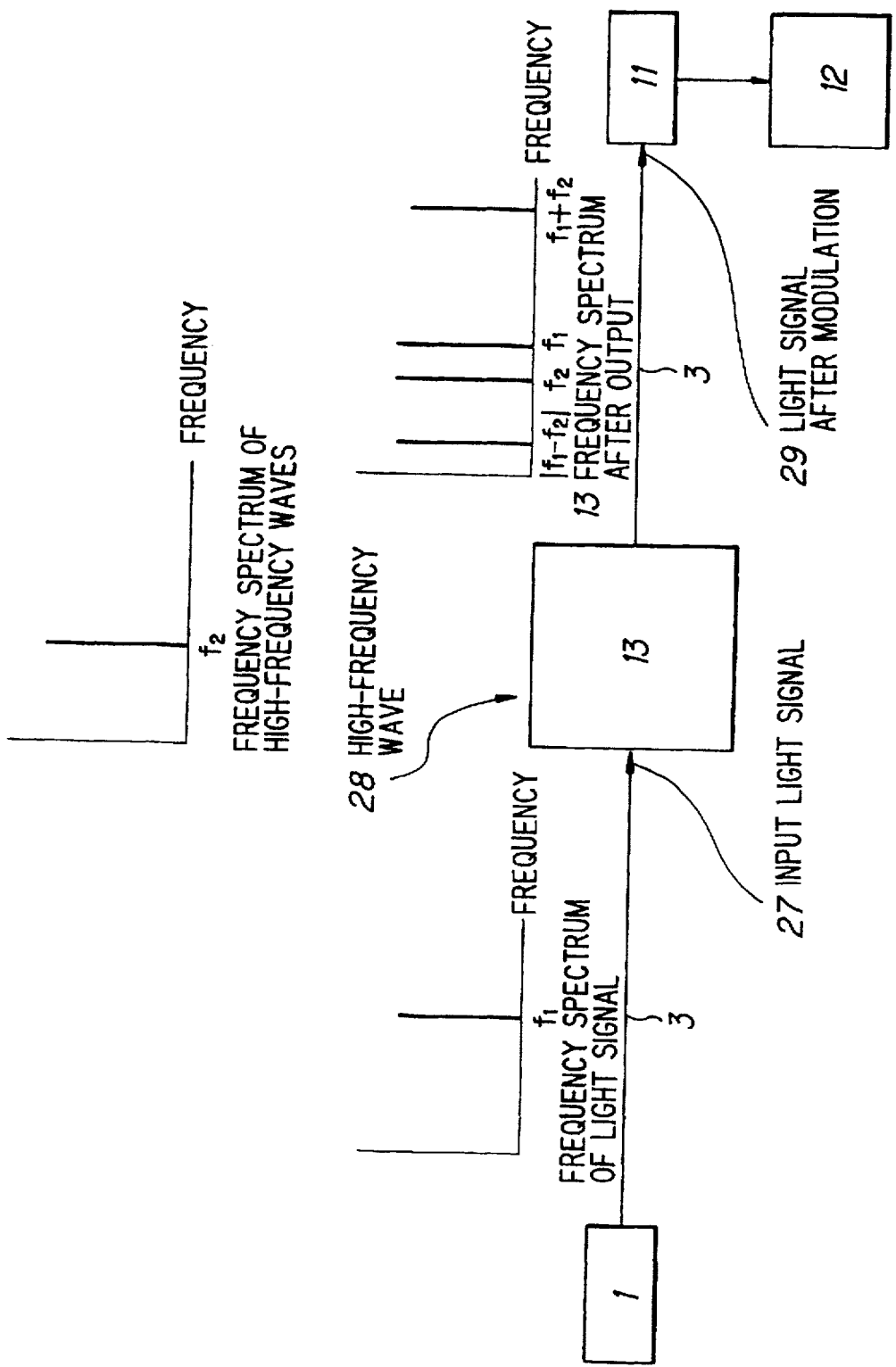
FIG. 13 is a view showing the second embodiment of an electromagnetic wave-to-optical signal converting and modulating device.

FIG. 13 shows another embodiment of the invention. The specific structure of the device is the same as in FIG. 4. Main difference from the first embodiment is that the light from the light source to be supplied to optical modulator 13 was constant in the first embodiment (which means that the light was unmodulated), but the light from the light source in the second embodiment has a certain frequency $f_1$ (angular frequency $\omega_1$).

When the light signal is inputted to optical modulator 13, it will be modulated with a high-frequency wave having an angular frequency of $\omega_2$ (frequency $f_2$). Here, if it is assumed that the input light power is sinusoidally intensity-modulated signal as represented by $P_{in}=P_1\sin\omega_1 t + P_B$ (here, since $P_{in}$ must not become negative, a d.c. bias $P_B$ is added), and a high-frequency wave (a voltage to be applied to the optical modulator) is represented by $V=V_1\cos\omega_2 t$, the light signal output $P_{out}$ will be represented as follows, in accordance with the formula (3):

$$P_{out}=\{P_B+P_1\sin\omega_1 t+(\pi P_B V_1/V_\pi)\cos\omega_2 t+(\pi P_1 V_1/2V_\pi)\:[\sin(\omega_1+\omega_2)t+\sin(\omega_1-\omega_2)t]\}/2 \qquad (4)$$

The first term in formula (4) is a d.c. component; the second term is the primary wave component of the frequency of the input light power; the third term is the primary wave component of the frequency of the high-frequency wave; the fourth term is the sum frequency component of the input light power and high-frequency wave; and the fifth term is the difference frequency component between the input light power and the high-frequency wave.

That is, for the electromagnetic wave-to-optical signal converting section (optical modulator 13), it is possible not only to receive a high-frequency wave signal, but also to simultaneously generate an intermediate-frequency (difference frequency component) signal for the heterodyne detecting scheme. This means no need of an electrically-based mixing means. Since only the intermediate-frequency component which has been converted down to a low frequency, is necessary at the optical detection stage, this structure has an advantage over the configuration in which the basic wave component is directly detected; that is, the frequency characteristic required for optical detector 11 can drastically be alleviated. In the satellite broadcasting, for example, if frequencies $f_1$ and $f_2$ are assumed to belong to 11 GHz and 12 GHz bands, respectively, the intermediate frequency $|f_1-f_2|$ will belong to 1 GHz band.

Third Embodiment

Figure 14:
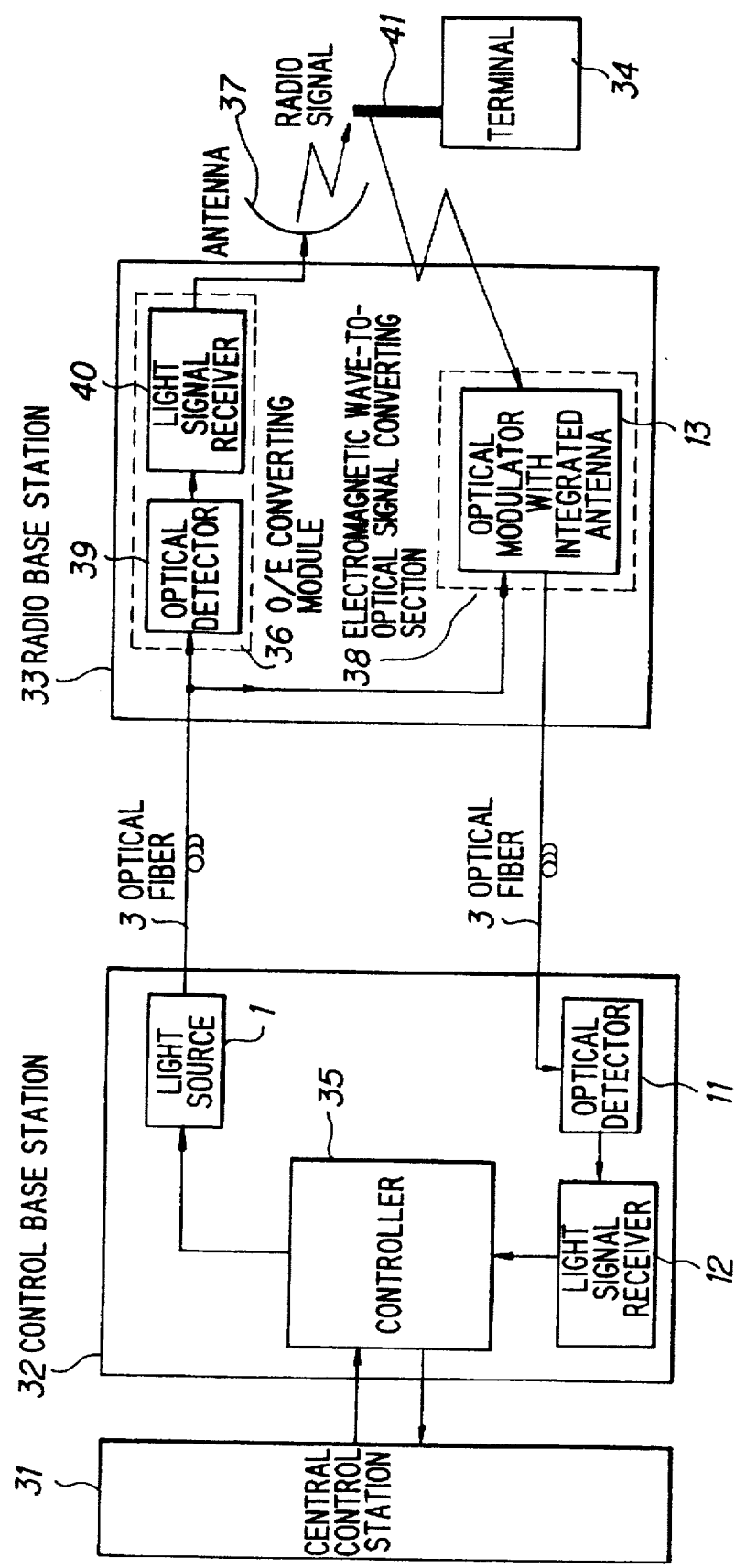
FIG. 14 is a block diagram showing a data communication system of the invention.

The use of the above electromagnetic wave-to-optical signal converting and modulating device of the invention will enable a system in which electromagnetic waves, light, and electric circuits are efficiently coupled. FIG. 14 shows a communication system example which uses the electromagnetic wave-to-optical signal converting and modulating device of the invention. In the figure, the system includes: a central control station 31; a control base station 32; a radio base station 33; and a terminal 34. Control base station 32 is comprised of a controller 35 for exchanging signals with the central control station 31; a light source 1; an optical detector 11; and a light signal receiver 12. Light source 1 outputs a light signal under the command of controller 35. This light signal is transmitted via an optical fiber cable 3 to radio base station 33.

Radio base station 33 includes: an O/E converting module 36 which coverts the light signal transmitted via optical fiber cable 3 into an electric signal; an antenna 37; and an electromagnetic wave-to-optical signal converting section 38. O/E converting module 36 is comprised of an optical detector 39 and an optical signal receiver 40.

The signal which has been converted into an electric signal is radiated from antenna 37 as a radio signal. This signal is received by terminal 34 and processed therein. Electromagnetic wave-to-optical signal converting section 38 is constructed of the aforementioned optical modulator 13 of the invention. This section 38, whilst receiving the light signal from light source 1, directly receives the radio signal radiated from an antenna 41 of terminal 34 so that the light signal will be modulated with the radio signal. The modulated signal is supplied to optical fiber 3. The information from terminal 34 is detected by optical detector 11 and light signal receiver 12, then supplied to controller 35.

Fourth Embodiment

Figure 15:
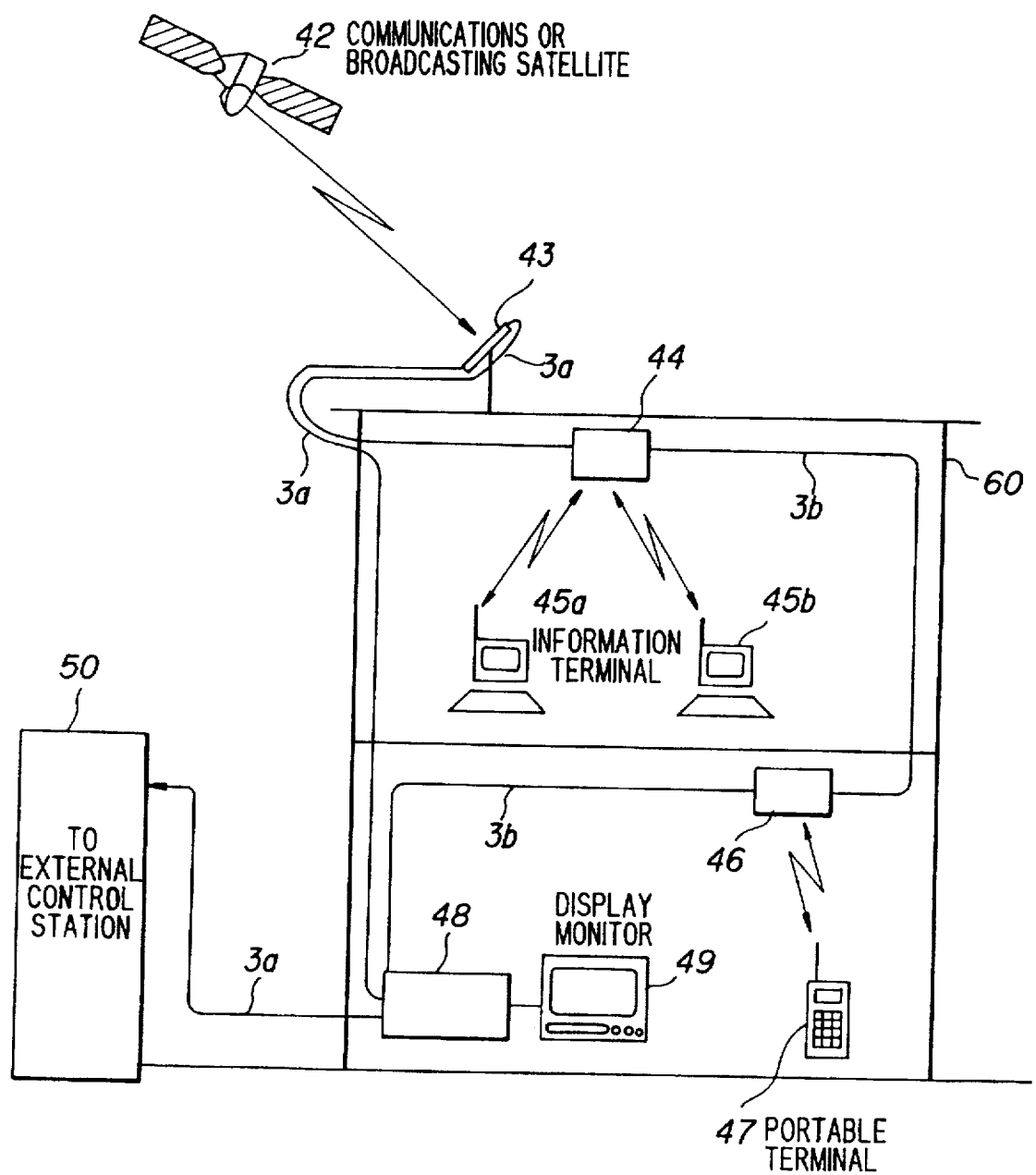
FIG. 15 is a block diagram showing a configuration in which the data communication system of the invention is applied to a receiving system for satellite broadcasting.

Next, FIG. 15 shows a communication system example in which the electromagnetic wave-to-optical signal converting and modulating device of the invention is applied to a satellite broadcasting receiver network. In this figure, designated at 42 is a communications or broadcasting satellite. The electromagnetic wave from this satellite 42 is received by a receiving antenna device 43 installed on the roof of a building 60. This receiving antenna device 43 has the optical modulator 13 of the invention so that the electromagnetic wave can directly be converted into a light signal. The receiving antenna device 43 is connected with optical fiber cable which forms the network.

The optical fiber cable is composed of sections 3b which are provided inside building 60 and sections 3a which are provided outside. Reference numerals 44 and 46 designate premises radio base stations installed inside building 60. These radio base stations 44 and 46 have a similar structure to that of radio base station 33 as shown in FIG. 14, so that it is able to exchange radio signals with information terminals 45a, 45b such as personal computers etc. or a portable terminal 47 such as a pocket telephone etc.

In this case, similarly to the case described with reference to FIG. 14, radio base stations 44 and 46 have optical modulators 13 so that radio wave signals from terminals 45a, 45b and 47 will directly be converted into light signals. Conversely, when radio signals are imparted to terminals 45a, 45b and 47, the light signal from cable 3b is converted into an electric signal by means of the optical detector and light signal receiver, and thereafter the converted signal is radiated from the antenna.

Designated at 48 is a premises control base station, to which a monitor display 49 is connected. This premises control base station 48 exchanges signals with an external control station 50 via external optical fiber cable 3a.

As has been described above, in accordance with the invention, electrodes formed on a substrate having the electro-optical effect are adapted to function as a detecting antenna for electric field signal in the external space so that light passing through optical waveguide will directly be modulated. This configuration has the following advantages:

(1) It becomes possible to attain high-sensitivity reception of signals in a specified frequency band range by using the resonant phenomenon in the receiving high-frequency range determined by the antenna size. Besides, it becomes possible to provide an electromagnetic wave-to-optical signal converting and modulating device having a high-efficient electromagnetic wave-to-optical signal converting section by designing and fabricating the electrodes for optical modulation so as to have the antenna function in conformity with the use frequency band and the directional performance to electromagnetic waves.

(2) Since the light signal and the electric field around the external space can be mixed by supplying a light signal from a light supplying means, having a specified frequency, it is possible to directly convert down the light signal to an intermediate-frequency signal, thus it becomes unnecessary to perform mixing in electric circuit means, thereby making it possible to slim the electric circuit portion. Further, the frequency characteristic required for the optical detector can be drastically be alleviated so that it is possible to efficiently couple the electromagnetic waves, light and electric circuits altogether.

From these merits, the present invention successfully provides an electromagnetic wave-to-optical signal converting and modulating device having a compact and efficient electromagnetic wave-to-optical signal converting section which has the antenna function for radio communications, although the conventionally reported electric field antennas using an optical crystal could not be used for this purpose. Further, by utilizing the merits, it becomes possible to construct a high-efficient system in which radio devices and optical fiber networks are synthetically integrated.

What is claimed is:

1. An electromagnetic wave-to-optical signal converting and modulating device for data communication comprising:
   a substrate for providing an electro-optical effect;
   at least a pair of optical waveguide paths which are formed on said substrate and arranged in parallel to each other and are joined at their ends;
   electrodes which are formed along said optical waveguide paths for providing an antenna function for detecting electric field signals around a external to the device;
   a light supplying means for supplying light to said optical waveguide paths; and
   a light signal receiving means for detecting light outputted from said optical waveguide paths and processing it,
   wherein the light which is passing through said waveguide paths and the device is directly modulated with an electric field signal carrying information located in a space external to the device.

2. An electromagnetic wave-to-optical signal converting and modulating device according to claim 1, wherein said electrodes constitute a dipole antenna.

3. An electromagnetic wave-to-optical signal converting and modulating device according to claim 2, wherein a metallic reflecting plate for reflecting electric fields around the space external to the device is provided on the substrate's surface opposite to the surface on which said electrodes are formed.

4. An electromagnetic wave-to-optical signal converting and modulating device according to claim 1, wherein a metallic reflecting plate for reflecting electric fields around the space external to the device is provided on the substrate's surface opposite to the surface on which said electrodes are formed.

5. An electromagnetic wave-to-optical signal converting and modulating device according to claim 1, wherein said light supplying means is a means for supplying unmodulated light having a constant intensity.

6. An electromagnetic wave-to-optical signal converting and modulating device according to claim 1, wherein said electrodes constitute a patch type antenna.

7. An electromagnetic wave-to-optical signal converting and modulating device according to claim 6, wherein a metallic reflecting plate for reflecting electric fields around the space external is provided on the substrate's surface opposite to the surface on which said electrodes are formed.

8. An electromagnetic wave-to-optical signal converting and modulating device according to claim 1, wherein said electrodes constitute a Yagi antenna.

9. An electromagnetic wave-to-optical signal converting and modulating device according to claim 8, wherein a metallic reflecting plate for reflecting electric fields around the space external is provided on the substrate's surface opposite to the surface on which said electrodes are formed.

10. An electromagnetic wave-to-optical signal converting and modulating device according to claim 1, wherein said electrodes constitute a half-wave ($\lambda/2$) dipole antenna in which a plurality of dipole antenna elements having different lengths are arranged along said optical waveguide paths.

11. An electromagnetic wave-to-optical signal converting and modulating device according to claim 10, wherein a metallic reflecting plate for reflecting electric fields around the space external is provided on the substrate's surface opposite to the surface on which said electrodes are formed.

12. An electromagnetic wave-to-optical signal converting and modulating device according to claim 1, wherein said light supplying means is a means for supplying light having a predetermined frequency.

13. An electromagnetic wave-to-optical signal converting and modulating device according to claim 1, wherein said light supplying means is a means for supplying light from a light source via an optical fiber.

14. An electromagnetic wave-to-optical signal converting device according to claim 1, wherein there are a plurality of antenna elements of different sizes, so that an enlarged receiving band width is obtained.

15. A data communication system according to claim 1 wherein the substrate includes an insulating cladding layer, so that loss of light during transmission of light is inhibited.

16. A data communication system comprising:
   an optical fiber network;
   a base station on said optical fiber network;
   an electromagnetic wave-to-optical signal converting and modulating device disposed said base station; and
   a terminal to which an electromagnetic wave signal received by said electromagnetic wave-to-optical signal converting and modulating device in said base station is transmitted,
   wherein said modulator includes: a substrate providing an electro-optical effect; at least a pair of optical waveguide paths which are formed on said substrate and arranged in parallel to each other and are joined at their ends; electrodes which are formed along said optical waveguide paths and have the antenna function for detecting electric field signals around a space external to the modulator;
   a light supplying means for supplying light to said optical waveguide paths; and a light signal receiving means for detecting light outputted from said optical waveguide paths and processing it, and said modulator is constructed so that the light which is passing through said waveguide paths is directly modulated with an electric field signal carrying information applied directly to the modulator.

17. A data communication system according to claim 16, wherein said electromagnetic wave-to-optical signal converting and modulating device receives electromagnetic waves from satellites and converts the received wave into a light signal so that the light signal is supplied to a network.

18. A data communication system according claim 16, wherein said electromagnetic wave-to-optical signal converting and modulating device is used as a receiving antenna device for satellite broadcasting, and forms a satellite broadcast receiving system which transmits the reception signal from satellites to satellite broadcast receivers via optical fibers.

19. A data communication system according to claim 16, further including a housing box surrounding all elements of the modulator, wherein the electrical field signal is applied directly to the housing box.

* * * * *